US009882559B2

(12) United States Patent
Amin

(10) Patent No.: US 9,882,559 B2
(45) Date of Patent: Jan. 30, 2018

(54) WIRELESS PROXIMITY SENSOR WITH A TARGET DEVICE COMPRISING AN INVERTER

(71) Applicant: Kawa Amin, Lund (SE)

(72) Inventor: Kawa Amin, Lund (SE)

(73) Assignees: Ray Perrier, Ontario (CA); Kawa Amin, Lund (SE)

( * ) Notice: Subject to any disclaimer, the term of this patent is extended or adjusted under 35 U.S.C. 154(b) by 386 days.

(21) Appl. No.: 14/362,463

(22) PCT Filed: Dec. 12, 2012

(86) PCT No.: PCT/SE2012/000200
§ 371 (c)(1),
(2) Date: Jun. 3, 2014

(87) PCT Pub. No.: WO2013/089609
PCT Pub. Date: Jun. 20, 2013

(65) Prior Publication Data
US 2014/0340080 A1    Nov. 20, 2014

(30) Foreign Application Priority Data

Dec. 16, 2011    (SE) ...................................... 1100926

(51) Int. Cl.
| H03K 17/95 | (2006.01) |
| G01S 13/75 | (2006.01) |
| G01S 13/76 | (2006.01) |

(52) U.S. Cl.
CPC ........ *H03K 17/9537* (2013.01); *G01S 13/758* (2013.01); *G01S 13/767* (2013.01); *H03K 17/954* (2013.01); *H03K 2217/958* (2013.01)

(58) Field of Classification Search
CPC ..... G01R 17/105; G01R 29/24; G01F 23/288; H03K 17/9535; H01H 35/00
(Continued)

(56) References Cited

U.S. PATENT DOCUMENTS

| 3,689,885 A | 9/1972 | Kaplan et al. |
| 5,291,152 A | 3/1994 | Seale |

(Continued)

FOREIGN PATENT DOCUMENTS

| EP | 0229247 A2 | 7/1987 |
| WO | 0064053 A1 | 10/2000 |

*Primary Examiner* — Melissa Koval
*Assistant Examiner* — Trung Nguyen
(74) *Attorney, Agent, or Firm* — Capitol City TechLaw

(57) ABSTRACT

A target device for use with a switch device of a proximity switch has a wireless receiver means (6) for detecting and receiving a first pulsating signal (A) with a first carrier frequency (f1) from a nearby transmitter module (5), demodulating (6, 7) the received signal, and if a superimposed digital signal is present, inverting (9, 10, C4, and Q1) the superimposed received digital signal or, if the superimposed digital signal is absent, passing the existing energy through (10). The target device also has a wireless transmitter means (12) for modulating and sending the inverted pulse train if this exists by the second carrier frequency (f2) to the receiver switch unit (13). Additionally, the target comprises functionality to transmit the carrier frequency (f2) continuous and unmodulated where a continuous and unmodulated carrier frequency (f1) is present. However, upon existence of the pulsating signal only one of the receiver (6) and the transmitter (12) receives or transmits a signal at a given time.

6 Claims, 5 Drawing Sheets

(58) Field of Classification Search
USPC ...... 324/200, 207.14–207.18, 219–225, 637, 324/639, 600; 330/9; 331/116 R, 23, 65; 307/116
See application file for complete search history.

(56) References Cited

U.S. PATENT DOCUMENTS

| | | | |
|---|---|---|---|
| 8,577,320 B2* | 11/2013 | Quinsat | G01R 33/09 331/177 R |
| 2011/0291819 A1* | 12/2011 | Kaeriyama | H01L 23/48 340/286.01 |
| 2013/0147655 A1* | 6/2013 | Kishigami | G01S 13/284 342/135 |
| 2013/0259144 A1* | 10/2013 | Takeda | H04L 25/0266 375/258 |

* cited by examiner

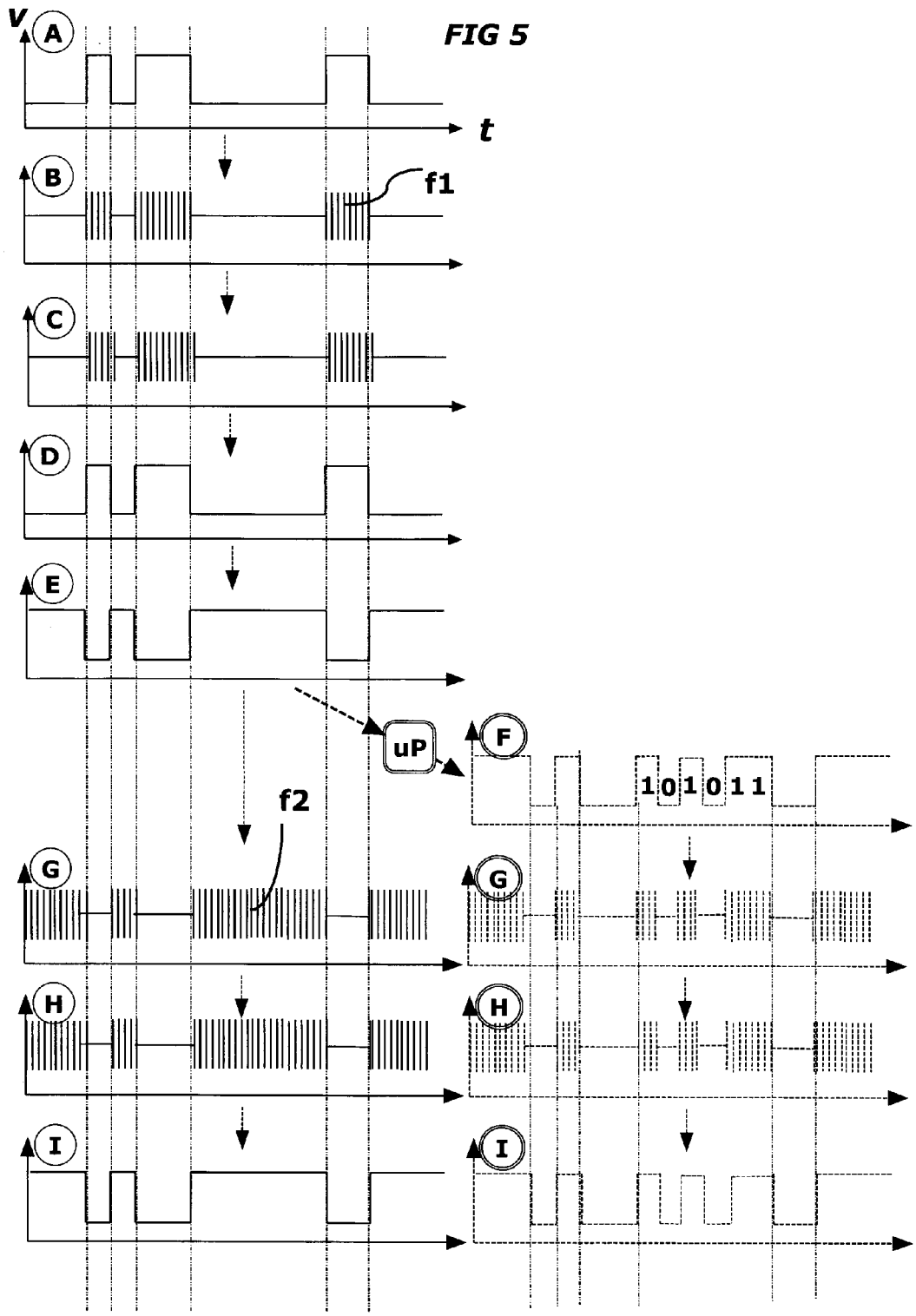

WIRELESS PROXIMITY SENSOR WITH A TARGET DEVICE COMPRISING AN INVERTER

TECHNICAL FIELD

The present invention relates to a target device for use with a switch device (or transceiver unit) of a proximity switch (or proximity sensor). The target device is arranged to detect and receive a superimposed carrier frequency. The carrier frequency is demodulated and if a superimposed digital signal is present, the superimposed received digital signal is inverted and then the inverted digital signal is with a carrier frequency and is transmitted to a receiver unit of the switch device in the same proximity switch or to a receiver in another proximity switch. The invention also concerns a solution to this inverting, so that the inverting takes place without delay, and the option to add a device so that the target device is assigned its individual code.

BACKGROUND

Proximity switch (for example as described in SE520154 which is a type of inductive proximity switch) are used in different applications to detect the presence or absence of a second object in relation to a first object. For this purpose, the first object is provided with a proximity switch, while the second object is provided with a target device, that can be detected by the proximity switch. For example, proximity switches are often used in industrial and potentially dangerous environments for assisting in ensuring operational safety of a machine or an industrial process. It uses a combination of a switch unit and a target device to detect whether a gate, a door, a hatch or similar is closed in a safe mode, whereby a human operator is prevented from direct access to a potentially dangerous machine or process, or whether the gate, the door, the hatch or similar suddenly is opened.

The proximity switch of SE520154 is a contactless safety sensor (comprising a switch device and target) for gates, hatchers etc. A pulsating pulse train signal from a safety module or safety PLC (Programmable logic controller) is transmitted via the switch with a first carrier frequency to the target where the first carrier frequency is changed to a different carrier frequency that differs from the first one and sent back to the switch. The safeguard of the proximity switch described above is based on inversion of the received pulse train with an inverter which is located in the switch device.

The proximity switch as described in SE520154 has been accepted as fulfilling the highest safety category requirements, but has a serious drawback in that the inversion is located in the switch device and not in the target device. In case there is an error in the receiving unit in the switch device, the transmittal of the modulated pulse train from the transmitter unit in the switch device may be received by the receiving unit of the switch and wrongly interpreted as an indication that the target is present, although this is not the case. In other words, there is a risk of crosstalk between these modules (transmitter and receiver unit in the switch device). Consequently, the "own" send signal is demodulates "incorrectly" and the received pulse train is inverted in the switch device section and is then sent on to the controller without detection of errors.

An error of this kind, which might be a ground contact error in the receiver filter of the switch device, changes the properties of the receiver filter and allows frequencies that should have been blocked to pass.

SUMMARY OF THE INVENTION

The purpose of the invention is to alleviate or solve the above problems.

According to the first aspect of the invention there is provided a target device for use with a switch device in a proximity switch. The target device includes a receiver for receiving a first pulsating signal from the switch device, an inverter arranged to generate an inverted signal by inversion of the first pulsating signal, and a transmitter for transmitting a second pulse signal to the switch device, wherein the transmitter is driven by the inverted signal, whereby only one of the receiver and the transmitter unit receives or sends a signal at a given time.

Since the inversion takes place in the target device the problems with crosstalk between a transmitter and receiver in switch device are reduced.

The first pulsating signal may have a first carrier frequency and the target device may also include a demodulator arranged to convert the first pulsating signal into a baseband signal, wherein the inverter is arranged to generate the inverted signal by inversion of the baseband signal.

The inverter may also include a capacitor arranged to be charged or discharged depending on a value of the first pulsating signal.

The first pulsating signal may include a pulse with a predetermined pulse width. Furthermore, the target device may include a processing unit having a predetermined code, wherein the processing unit is arranged to detect a pulse in the inverted signal corresponding to said pulse with a predetermined pulse width, and to generate and add an encoded signal in the inverted signal detected during the detected pulse based on the predetermined code.

According to another aspect of the invention there is provided a proximity switch including a switch unit and a target device according to the first aspect, wherein the switch unit is arranged to transmit the first pulsating signal to the target device and to receive the second pulsating signal from the target device.

BRIEF DESCRIPTION OF THE DRAWINGS

The present invention will be described in more detail in the following with reference to the attached drawings, on which

FIG. 5 is a sequence of diagrams that illustrate the appearance of pulsating signals at selected nodes in the target device and the switch unit as shown in FIG. 1

DETAILED DESCRIPTION OF THE INVENTION

Figure 1:
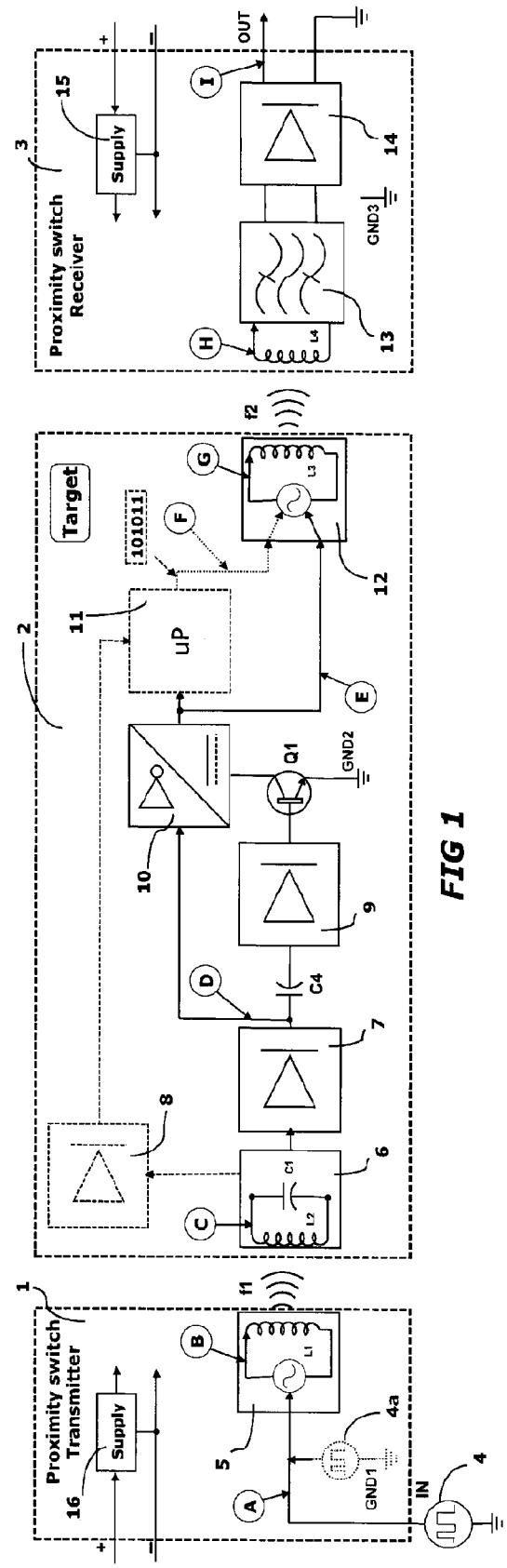
FIG. 1 is a schematic block diagram of a target device and a switch unit according to an embodiment of the invention.

FIG. 1 is intended to illustrate the basic function of a target device 2 for use with a switch unit 1, 3 in a safe proximity switch according to the invention. The proximity switch makes use of dynamic signals, and inversion of the dynamic signal in the proximity switch, which implies that this switch is categorized as a safe proximity switch.

A proximity switch is used to wirelessly detect whether a moving object is present within a predetermined distance of a proximity switch or not. In order to achieve this, the movable object (which may be a door, window, gate, hatch, etc) is provided with a target, which does not have to be electrically connected to a power supply.

A preferred embodiment of the invention (target device 2) together with the switch unit 1, 3 is schematically illustrated in FIG. 1. The proximity switch is electrically connected to one/two external power sources 15 and 16 via a pair of poles (+ and −) for direct current. -Here, two different supply voltages are used for reasons of safety, but with a suitable separation technique one power supply voltage may be used.

Proximity switch 1, 3 has an input terminal IN and an output OUT. A dynamic control module 4 or 4a, where 4a can be internal is connected to the input In and is adapted to receive a digital or pulsating input signal, which according to the following description will be used to power a transmitter 5, so that it transmits the digital signal, after having been modulated onto a high frequency carrier wave, to the target 2.

The target 2 will receive the high-frequency signal and in response return another high-frequency signal, containing the same digital signal but an inverted version thereof, whereby the target 2 confirms its presence in proximity of the proximity switch 1, 3.

The pulsating or digital input signal may either be symmetric or an asymmetric digital signal which switches between low and high values, representing digital values 0 and 1, respectively. Consequently, if the pulsed input signal is asymmetric, its contents will represent a set of digital information, which will be transmitted through the proximity switch 1 to the target 2, where it is inverted and then be returned from the target 2 to the proximity switch 3 to finally arrive at the output terminal of the proximity switch. In this way an external device, such as any commercially available safety relay, may be connected to the input terminal In and the output terminal Out for monitoring that a digital input signal entered through the input terminal In is safely returned at the output terminal out, thereby indicating that the target 2 is present proximate to the proximity switch 1, 3.

An arrangement of an oscillator/control transmitter module 5 is connected at its input to the dynamic control module 4, 4a. The oscillator/control transmitter module 5 comprises in addition to control circuits a resonant circuit (LC circuit) that is tuned to a resonant frequency with a predetermined value. This resonance frequency, which will be the carrier frequency of the high frequency signal transmitted from the oscillator/control transmitter module 5 to the target 2, is hereinafter referred to as f1. The resonant circuit of the transmitter module 5 will stop when the dynamic control module 4, 4a assumes a dynamically low value, and when this signal goes dynamically high, the resonant circuit of the transmitter module 5 will start in a corresponding manner. When the dynamic control module 4, 4a is statically high or low, the oscillator will continue to oscillate. In this way, the pulsating digital signal is modulated onto the carrier in an amplitude shift coded way (ASK).

The target 2, which in a real application may be mounted at a distance of between 0 and e.g. 15 mm from the proximity switch 1, 3, comprises a receiver/rectifier module 6, 7, which is tuned to the frequency f1 of the oscillator/control transmitter module 5 and which therefore can receive a signal transmitted by the transmitter module 5. The receiver/rectifier module 6, 7 further comprises circuitry for rectifying the received signal.

The receiver/rectifier module 6, 7 is followed by a capacitor C4 of a rectifier/demodulator module 9 and an inverter/bypass module 10, see FIG. 1. The capacitor C4 is a dynamic filter capacitor that lets the pulsating signal through to the rectifier/demodulator module 9, which according to FIG. 2 includes circuitry for converting the pulsating signal into a baseband signal. The baseband signal is used to drive a bipolar transistor Q1, which in turn is connected to the inverter/bypass module 10 where Q1 is used as an indication of the presence of the pulsed signal.

The inverter/bypass module 10 includes circuitry for charging and discharging of a capacitor by means of which the inversion of the incoming pulse signal is carried out, and circuitry for rectifying the received signal and output the same as driving power to an oscillator/control transmitter module 12 in the target 2.

The oscillator/control transmitter module 12 driven by the inverter/bypass module 10 includes in addition to control circuits a resonance circuit (LC-circuit), which is tuned to a resonance frequency f2. The oscillator in the oscillator/control transmitter module 12 starts upon reception of this energy and consequently stops when the supply of such energy ceases.

The drive power from the receiver/rectifier module from 6, 7 will therefore be synchronous with but oppositely directed to the digital signal modulated onto the carrier from the oscillator/control transmitter module 12 of the target 2.

Now reverting to FIG. 1 where the proximity switch 1, 3 further comprises a receiver/rectifier module 13, 14 with a receiver circuit that is tuned to the same frequency f2 as the transmitter circuit of the oscillator/control transmitter module 12 of the target 2. The receiver/rectifier module 13, 14 also comprises rectifying circuitry for rectifying and amplifying the signal received from the oscillator/control transmitter module 12 at target 2. The output signal of the receiver/rectifier module 13, 14 then goes to the terminal output of the switch 3.

FIG. 1 has a plurality of signal nodes labeled A through I. The signal values at these signal nodes are illustrated in FIG. 5 for an exemplary digital input signal, while schematic circuit diagrams of the proximity switch 1, 3 and the target device 2 are given in FIGS. 1-4.

For reasons of clarity the oscillator/control transmitter module 5 and the receiver/rectifier module 13, 14 are not illustrated in detail.

The operating principle of the proximity switch 1, 3 and the target 2 according to the preferred embodiment will now be described with reference to FIGS. 1-5.

A pulsating digital input signal is received at the input terminal In of the proximity switch 1 (node A), and then into the oscillator/control transmitter module 5. The first diagram of FIG. 5 illustrates an example of a short portion of the pulsating input signal at node A.

As shown in FIG. 1 the oscillator/control transmitter module 5 comprises, in addition to adaptation circuitry, also the oscillator which together with a coil L1 is tuned to a resonance frequency f1. The oscillator can be selected from well-known oscillators as Hartley oscillators or Colpitts oscillators, or oscillators suitable for the application at hand. The coil L1 plays an active role in the resonant circuit, and also acts as a transmitting means for transmitting an inductive signal B to the target 2. As illustrated in the second diagram of FIG. 5, the resonant circuit in the oscillator/ control transmitter module 5 starts oscillating and transmitting at a high frequency f1 when the oscillator input is either dynamic or static low or high. The resonant circuit oscillation and transmission stops when the input signal goes dynamically low. Therefore, the transmitter coil L1 in the oscillator/control transmitter module 5 will start and stop in synchronization with a dynamic input signal and will transmit constantly when the input signal is static low or high. In practice, the pulsating signal received at the input In of the proximity switch 1 will be modulated or encoded onto the high-frequency signal generated by the resonant circuit in the oscillator/control transmitter module 5, wherein a modulated signal is formed by amplitude shift encoding (ASK), with a carrier frequency f1 as shown at a node B.

Figure 2:
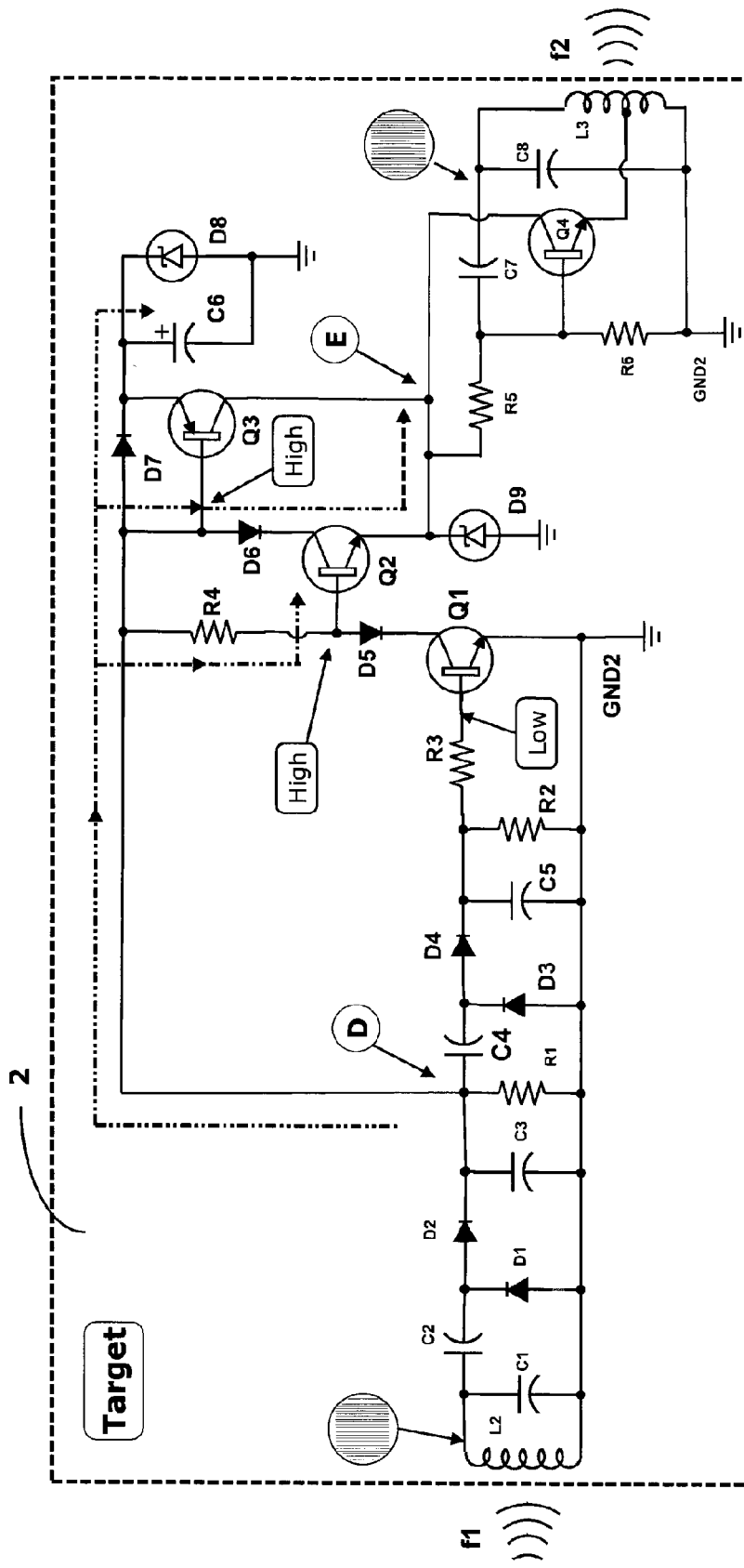
FIG. 2 is a schematic circuit diagram of the target device as shown in FIG. 1, where arrowed dashed lines show the charging progress at static low or high input signal.

The inductive signal transmitted by said oscillator circuit is received at the target 2 as a signal C by the receiver/rectifier module 6, 7. As shown in FIG. 2, receiver/rectifier module 6, 7 of the target 2 comprises a tuned resonant circuit having a receiving coil L2 and a first capacitor C1 connected in parallel therewith. The resonant circuit with L2 and C1 is tuned to the resonance frequency f1 of the oscillator/control transmitter module 5 of the proximity switch.

The receiver/rectifier module 6, 7 further comprises a dynamic control capacitor C2 and a rectifier circuit comprising two diodes D1, D2, a filter capacitor C3 and a resistor R1.

The receiving coil L2 will receive the inductive energy emitted by oscillator transmitter module and rectify this energy in the rectifying circuit D1, D2. At the output of the receiver/rectifier module 6, 7, i.e. the signal D (node D), the energy received from the module 6, 7 will vary in a pulsating fashion in synchronisation with the pulsed input signal A.

The energy at node D is applied both to the input of the inverter/bypass module 10, and through the dynamic control capacitor C4 to the input of the rectifier/demodulator module 9, which comprises two diodes D3, D4 and a filter capacitor C5, and first and second resistors R2, R3. The rectifier/demodulator module 9 is arranged for converting the first pulsating signal to a baseband signal, when the first pulsating signal from node D goes passes the dynamic control capacitor C4. This pulsating signal is received by the rectifier/demodulator module 9 for rectifying this energy in the rectifier circuit D3, D4 and C5. This energy will remain as long as the received dynamic pulsating signal exists. This energy also leads to drive a subsequent bipolar transistor Q1 (NPN) as in FIGS. 1-4 to a saturated state via resistors R2, R3.

Figure 3:
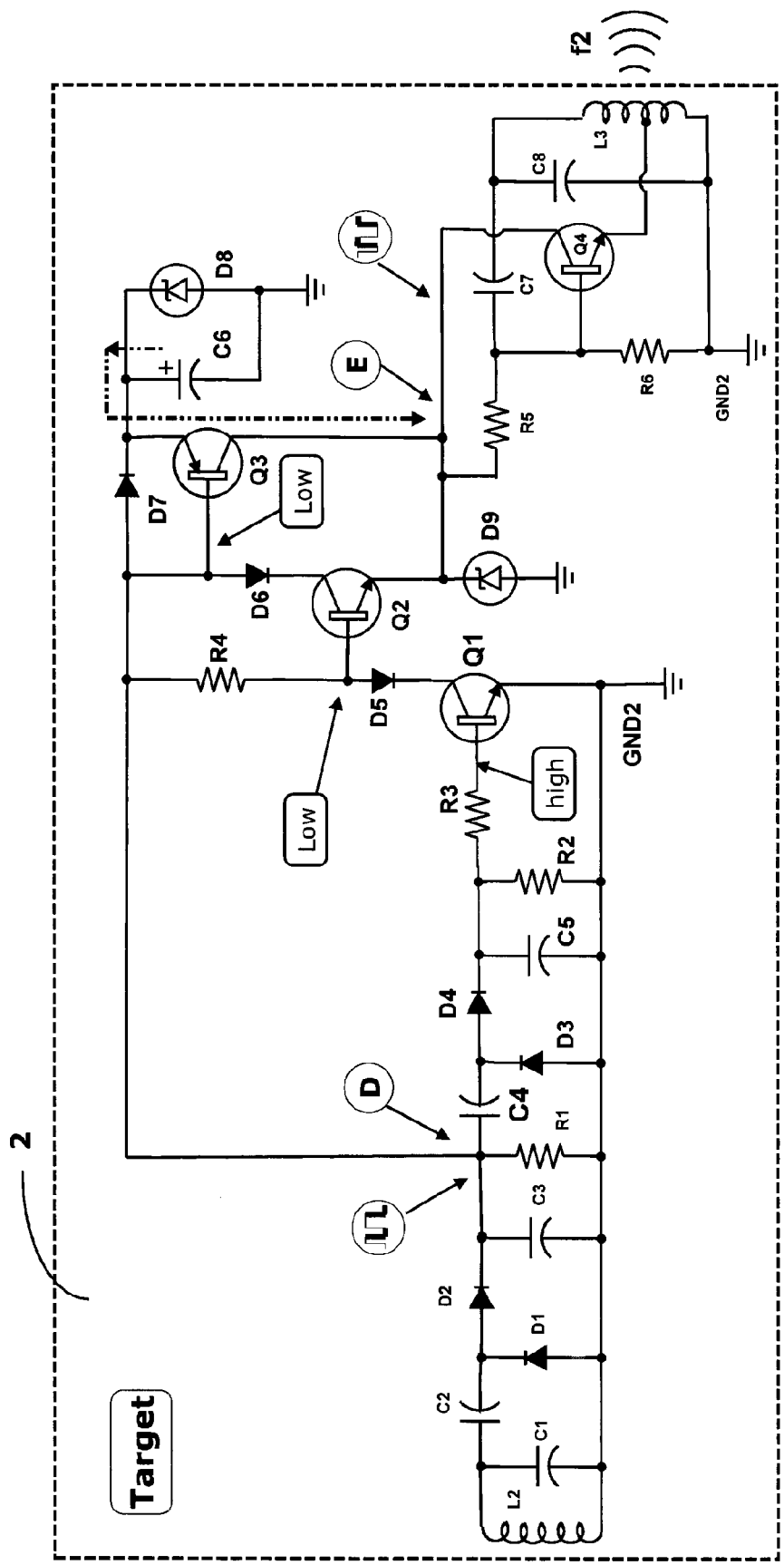
FIG. 3 is a schematic circuit diagram of the target device as shown in FIG. 1, where arrowed dotted lines illustrate discharge cycles in dynamic low input signal.
Figure 4:
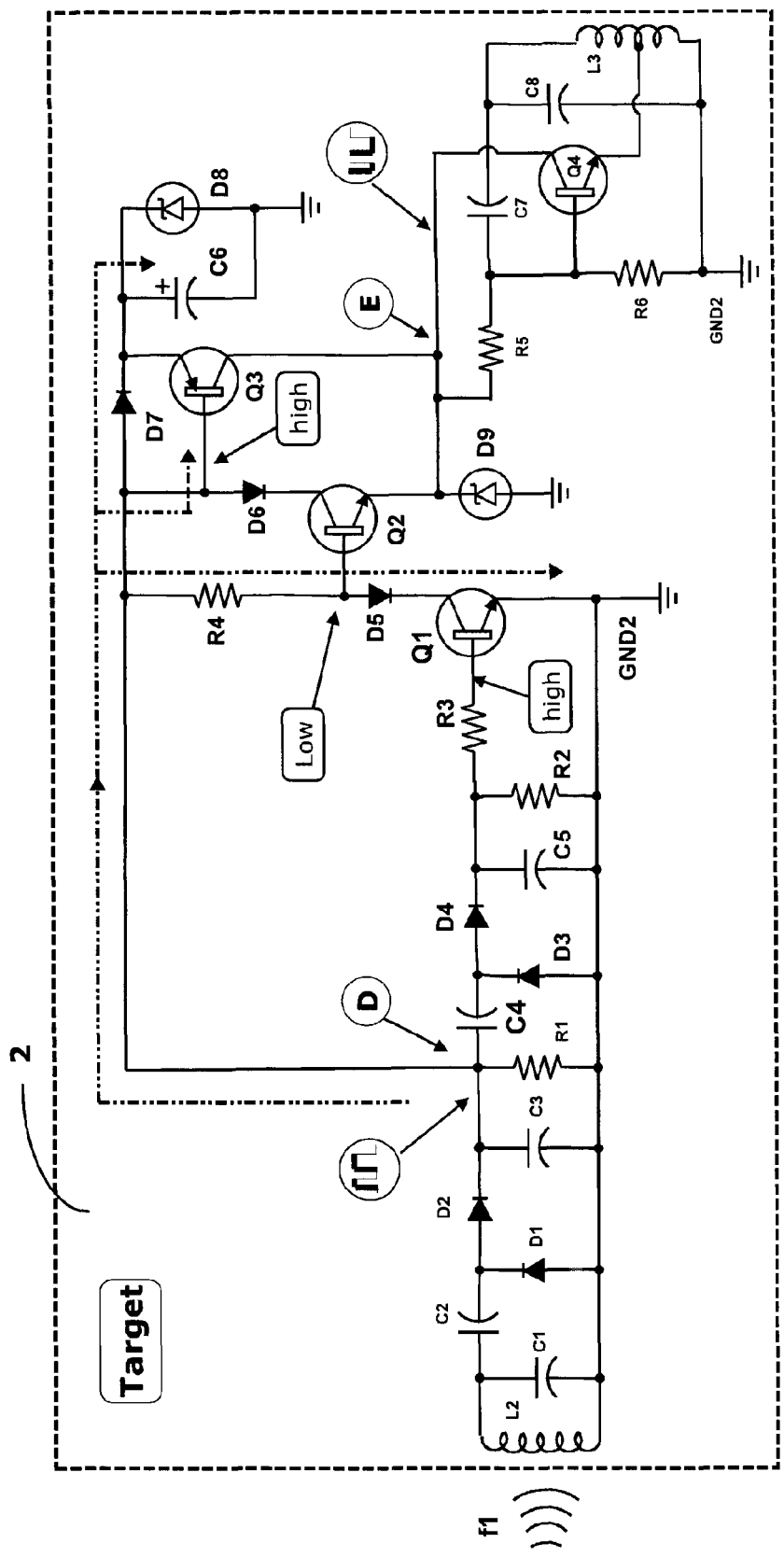
FIG. 4 is a schematic circuit diagram of the target device as shown in FIG. 1, where arrowed dashed lines show the charging progress in dynamic high input signal.

As shown in FIGS. 2-4, the inverter/bypass module 10 comprises includes a first resistor R4, and two diodes D6, D7, which together with the base of a first PNP bipolar transistor Q3 all form a common node, and thereby constitute the input of the module. Further, the inverter/bypass module 10 comprises a third diode D5 the anode of which is connected to the base of a second NPN bipolar transistor Q2, which together with the other end of the resistor R4 form a second common node.

A third common node is formed between the cathode of D7, the cathode of a first zener diode D8, the plus pole of a first capacitor C6, and the emitter of the PNP bipolar transistor Q3. A fourth and last common node (node E), which also constitutes the output of the module is formed between the emitter of Q2, the cathode of a second zener diode D9, and the collector of Q3.

Returning to the node D where the working principle of the inversion and the working mechanism between the modules and the circuitry according to the preferred embodiment will now be described with reference to FIGS. 1-5.

As shown above, the resonant circuit in the oscillator/control transmitter module 5 starts oscillating and transmitting at a high frequency f1 to the target 2 when the signal of the dynamic control module 4, 4a is either dynamically high or statically low or high.

In absence of dynamic pulses during a longer time period (a time period that is greater than the maximum pulse width contained in the signal) or when the signal of the dynamic control module 4, 4a is statically low or high, the node D will be statically high, see FIG. 2. Then the energy at node D is only supplied to the inverter/bypass module 10 and latched to the rectifier/demodulator module 9 by the dynamic filter capacitor C4.

The energy received by the inverter/bypass module 10 from node D will be divided into three parts. The first part of this energy is passed via R4 to drive Q2 into saturated mode. Consequently, the second energy is passed through D6 and Q2 (CE) to node E and thus to feed the oscillator/control transmitter module 12. This causes the resonant circuit in the oscillator/control transmitter module 12 to start oscillating and transmitting at a high frequency f2 to the receiver switch unit 13, and further through the rectifying module 14 to the terminal output of the switch 3 as a static high signal, which is also an indication of the presence of the target 2.

The third energy of node D is now led as a charging current through D7 down to the positive side of the capacitor C6. The negative side of C6 is connected to the neutral line (GND2) of the target. This results in a closed current path, whereby the capacitor C6 is charged. This charge is limited by zener diode D8. It may also be noted that the PNP bipolar transistor Q3 is arranged to function as a valve for controlling the charging and discharging paths. In the charging state the PNP transistor Q3 is not in active mode, so no current flows through it. The above power energy routes are indicated in FIG. 2 by arrowed dashed lines.

FIG. 3 illustrates the other case, when the signal from the dynamic control module 4, 4a is dynamically low. Consequently, also the signal at node D is dynamically low (node D follows node A dynamically).

In FIGS. 3-4, the collector of the bipolar transistor Q1 is connected to the cathode of D5, and as described above, when the first pulsating signal exists, Q1 enters into saturation mode, which also leads to the base of the PNP bipolar transistor Q3 ending up at a lower potential than the emitter, which causes Q3 to enter saturation mode. Then the discharge path of the capacitor C6 is opened by Q3 and the discharge current indicated by the arrowed dashed lines goes to input (node E) the oscillator/control transmitter module 12, which also leads to the resonant circuit in the oscillator/control transmitter module 12 to start oscillating and transmitting at a high frequency f2 (node G) to the receiver switch unit 13 (node H) and further through the rectifying module 14 to the switch output as a high dynamic high signal (node I).

FIG. 4 illustrates the third and final case, namely when the first pulsating signal still exists, and the signal is dynamically high shortly after having been dynamically low. As previously described, the signal at node D dynamically follows the signal at node A, and therefore the signal at node D is also dynamically high. Here, as in the first case, the charging of the capacitor C6 starts, but unlike the first case, no energy is supplied to the oscillator/control transmitter module 12 (node E is low). This part of the energy is passed through R4, D5 and Q1 (CE) to the ground (GND2) since Q1 remains in saturation mode, and Q2 (NPN) is cut off (because of lower potential in the node between R4 and the anode of D5). Thus the second current energy path is blocked by Q2. Now D7 once again leads the last current energy path for recharging capacitor C6. The bipolar PNP transistor Q3 once again takes the valve role and blocks discharge of the capacitor C6 while charging is in progress. In the charging state the PNP transistor Q3 is cut off.

Returning to FIG. 1, the oscillator/control transmitter module 12 includes a Hartley oscillator with first and second resistors R5, R6, a bipolar transistor Q4, a first capacitor C7 and a transmitting resonance circuit, which comprises a second capacitor C8 being connected in parallel with a transmitter coil L3, which in the middle of its winding has an output which is connected to the emitter of the transistor Q4. The transmitting resonant circuit L3, C8 is tuned to a resonance frequency f2. Transmitting resonant circuit L3, C8 will start and stop synchronously with node E, and in opposite phase to the energy (node D) received from the receiver/rectifier module 6, 7.

The inductive signal G from the target 2 is received by the receiver/rectifier module at 13, 14 in the proximity switch 3 as a signal H. As shown in FIG. 1 the receiver/rectifier module 13, 14 comprises a receiving resonant circuit with a receiver coil L4 and a band pass filter including a set of capacitors and inductors which is tuned to the prevailing frequency, namely f2. The coil L4 forms part of this filter and together with its set it is tuned to the same resonance frequency f2 as the oscillator/control transmitter module 12.

The receiver resonant circuit 13 is followed by a rectifier circuit 14, which comprises components similar to that of the rectifier module 7 of the target 2. The output of the receiver/rectifier module 13, 14 is emitted as a signal I which is the inverse of the signal A, and goes to the output of the proximity switch 3. Such a pulsating response signal is synchronous with the inverse of the pulsating input to the proximity switch 1.

As a summary of the above, a pulsating input signal A transmitted to the proximity switch 1 is modulated onto a high frequency carrier B, which is emitted in the form of an inductive signal by the oscillator/control transmitter module 5. Only under the condition that the target 2 is proximal the proximity switch 1, this signal will be inverted and returned at another carrier frequency f2 to the receiver/rectifier module 13 in the proximity switch 13. If the target 2 is present, the output Out of the proximity switch 3 will hence exhibit a pulsed signal I, which has the same digital content as the pulsating input signal A and is synchronous but inverted relative thereto.

Since the resonant circuits of the oscillator/control transmitter module 5 and the receiver/rectifier module 13 are tuned to different frequencies there is no risk of crosstalk between these modules. If a failure in terms of earth fault/leakage in the receiver/rectifier module 13 still would occur, the failure will be detected because the inversion occurs in the target 2 and not in proximity switch 1, 3. A pulsating signal will only be transmitted through proximity switch 1, 3 from input In to the output Out in inverted form if the target 2 is present. Since the output signal I at terminal output OUT is the inverse of the input signal A at the terminal input In, an accidental short circuit or a break anywhere in the proximity switch will be detected, because the output signal will then be identical to the input signal without any inverting.

(Since inverting pulses takes place in the target it is no risk from a safety perspective that f1 and f2 have the same frequency modulation, in this case the circuit scheme of 13 must be recast in another means).

As shown in FIG. 1, a microprocessor module 8, 11 may advantageously be integrated into the target. Then the target devices are assigned their own individual codes, which is yet an additional safety arrangement to reducing the risk of manipulations with proximity switches, which are common phenomena occurring in the industrial environments. Since these codings, as shown in FIG. 1, node F, are added (by the microprocessor which is controlled by incoming pulse trains (node E)) in predetermined "gaps" in the pulse train, it is still possible to perform a so-called cascade coupling of several proximity switches in series.

Finally, there are many inventions in various designs of proximity switches/targets and not least there are various means of communication between the switching devices and target devices, each of which dissolves in its own way a specific problem. This invention is directed to proximity switches in machine safety that uses dynamic pulses and inversion of these dynamic pulses in the proximity switch which is the guarantor of safety. But this invention can be used very well in many other similar situations that may require that this pulse inversion take place inside the target device. This invention technology enables a wired and a wireless (no fixed power) electromagnetically close device to communicate synchronously, which can also even be a new way of how a "new RFID" advantageously may be designed in the future. Therefore, the invention is not limited to anything other than the inventive concept as defined by the appended independent claims. Other embodiments than those disclosed above are equally possible within the scope of the invention.

What is claimed is:

1. A target device for use with a transceiver unit, the target device comprising:
    a receiver for receiving a first pulsating signal from the transceiver unit;
    a transmitter for transmitting a second pulsating signal to the transceiver unit; and
    an inverter arranged to generate an inverted signal by inversion of the first pulsating signal;
    wherein the transmitter is driven by the inverted signal, whereby only one of the receiver and the transmitter receives or sends a signal at a given time; and
    wherein the target device is powered by electromagnetic radiation from the transceiver.

2. A target device as in claim 1, wherein the first pulsating signal has a first carrier frequency and wherein the target device further comprises:
    a demodulator arranged to convert the first pulsating signal into a baseband signal, and
    wherein the inverter is arranged to generate the inverted signal by inversion of the baseband signal.

3. A target device as in claim 1, wherein the inverter includes a capacitor arranged to be charged or discharged depending on a value of the first pulsating signal.

4. A target device as in claim 1, wherein the first pulsating signal includes a pulse with a predetermined pulse width, and the target device further includes:
    a processor unit having a predetermined code which processor unit is configured to detect a pulse in the inverted signal corresponding to said pulse with a predetermined pulse width, and to generate and add an encoded signal in the inverted signal during the detected pulse based on the predetermined code.

5. A proximity sensor comprising:
    a transceiver unit; and
    a target device according to claim 1;

wherein the transceiver unit is arranged to transmit the first pulsating signal to the target device and to receive the second pulsating signal from the target device.

6. A target device for use with a transceiver unit, the target device comprising:
- a receiver for receiving a first pulsating signal from the transceiver unit;
- a transmitter for transmitting a second pulsating signal to the transceiver unit; and
- an inverter arranged to generate an inverted signal by inversion of the first pulsating signal;
- wherein the transmitter is driven by the inverted signal;
- wherein the target device stores received energy from the pulsating signal to power internal circuitry of the target device for communication with the transceiver unit; and
- wherein only one of the receiver and the transmitter receives or sends a signal at a given time.

* * * * *